United States Patent [19]
Beane

[11] Patent Number: 6,003,586
[45] Date of Patent: *Dec. 21, 1999

[54] HEAT-SINKING STRUCTURES AND ELECTRICAL SOCKETS FOR USE THEREWITH

[76] Inventor: Glenn L. Beane, Perch Pond Rd., R.F.D.3, Plymouth, N.H. 03264

[*] Notice: This patent is subject to a terminal disclaimer.

[21] Appl. No.: 08/392,131

[22] Filed: Feb. 22, 1995

Related U.S. Application Data

[63] Continuation-in-part of application No. 08/238,201, May 4, 1994, abandoned, which is a continuation of application No. 08/068,694, May 27, 1993, abandoned, which is a continuation of application No. 07/609,267, Nov. 5, 1990, Pat. No. 5,215,140.

[51] Int. Cl.$^6$ .................................................. B22D 18/06
[52] U.S. Cl. ............................................. 164/63; 164/65
[58] Field of Search .................................. 164/61, 62, 63, 164/65, 254, 256, 129, 305, 410

[56] References Cited

U.S. PATENT DOCUMENTS

| | | |
|---|---|---|
| 698,593 | 4/1902 | Veeder . |
| 3,987,844 | 10/1976 | Vitanov et al. ............................ 164/61 |
| 4,463,793 | 8/1984 | Thurner . |
| 4,541,475 | 9/1985 | Goddard et al. ........................... 164/65 |
| 5,215,140 | 6/1993 | Beane ....................................... 164/65 |
| 5,259,436 | 11/1993 | Yun et al. . |

FOREIGN PATENT DOCUMENTS

| | | |
|---|---|---|
| 1082706 | 6/1960 | Germany . |
| 1117829 | 11/1961 | Germany . |
| 1132687 | 7/1962 | Germany . |
| 11138516 | 10/1962 | Germany . |
| 39 11 867 A1 | 10/1990 | Germany . |
| 68483 | 7/1992 | Germany . |
| 58-205668 | 11/1983 | Japan ....................................... 164/61 |
| 59-47044 | 3/1984 | Japan ....................................... 164/63 |
| 61-253160 | 11/1986 | Japan ....................................... 164/65 |
| 63-80957 | 4/1988 | Japan ..................................... 164/129 |

OTHER PUBLICATIONS

Cambridge Tool Sales & Mfg. Co. Inc. letter dated Aug 31, 1995 from Dieter B. Morlock, President.
Cambridge Tool Sales Flyer entitled "Heavy Metal Preformance".
Cambridge Tool Sales Flyer entitled "HeatSinks".
Chicago White Metal Casting, Inc. letter dated Jan. 12, 1995 from Mike Dimitroff.
William R. Diem, "Gas–Discharge Headlights Attract Makers," Automotive News, May 30, 1994, p. 35.
R. M. German, *Powder Metallurgy Science*, Metal Powder Industries Foundation, Princeton, NJ, 1984.
The Society of Die Casting Engineers, Inc., Transactions, SDCE 13th International Die Casting Congress and Exposition, Milwaukee, WI, Jun. 3–6, 1985, p. 4.

*Primary Examiner*—Kuang Y. Lin
*Attorney, Agent, or Firm*—Fran S. Wasserman

[57] ABSTRACT

A process of making a heat-sinking structure, which includes providing a mold having cavities closed at one end and open at another end, the cavities corresponding to the heat dissipating surfaces on the heat-sinking structure, at least partially evacuating ambient gases from the cavities by applying a vacuum to the open end of the cavities, filling the mold with molten material when the mold is substantially evacuated by introducing the thermally conductive material into the mold at the open end of the cavities, and solidifying the thermally conductive material in the mold and removing the resultant molded heat-sinking structure. A combination electromagnetic interference filter and electrical socket assembly is also provided that includes an electromagnetic interference filter, at least one conductive, single-piece, electrical terminal blade passing through the electromagnetic interference filter, and a block of electrically insulating material. The terminal blade provides an electrically conductive path and also provides a connection mechanism configured to inter-fit with another electrical conductor. The electromagnetic filter comprising the single-piece electrical terminal blade is molded into the block of electrically insulating material to form an electrical socket. The single-piece electrical terminal blade passes through the block of electrically insulating material and has exposed ends.

15 Claims, 5 Drawing Sheets

HEAT-SINKING STRUCTURES AND ELECTRICAL SOCKETS FOR USE THEREWITH

CROSS REFERENCE TO RELATED APPLICATIONS

This is a continuation-in-part of U.S. patent application Ser. No. 08/238,201, filed May 4, 1994, now abandoned, which is a continuation of U.S. patent application Ser. No. 08/068,694, filed May 27, 1993, now abandoned, which is a continuation of U.S. patent application Ser. No. 07/609,267, filed Nov. 5, 1990, now U.S. Pat. No. 5,215,140, the entire disclosure of which is hereby incorporated herein by reference.

BACKGROUND OF THE INVENTION

This invention relates to heat-sinking structures, and methods of making heat-sinking structures, as well as electrical sockets for use therewith.

Heat sinks commonly are attached to electronic devices (e.g., integrated circuits) to dissipate the heat which the devices generate during operation. In order to do this, the heat sinks are designed to have a maximum surface area, the size of which determines their heat dissipating capacity, while still occupying the smallest possible volume so that the heat sink takes up as little usable space as possible in the electronic assembly.

Most heat sinks have flat surfaces called fins to dissipate the heat, and one type of heat sink, called a "pin fin" heat sink, comprises a matrix of separate pins that extend from a backing plate. In each case, the metal fins or pins serve as the heat-dissipating elements for the heat sink. In many cases, the side of the backing plate opposite the fins or pins is adapted to be mounted or otherwise secured to the electronic device to be cooled. During operation, the heat sink may be further cooled by blowing air vertically or horizontally over and between the fins or pins.

Some heat sinks, including the pin fin types, are fabricated using conventional die casting techniques in which a reusable steel mold containing cavities that correspond to the fins or pins of the heat sink is filled with molten metal such as zinc or aluminum. After the metal has solidified, the heat sink is withdrawn from the mold and finished for use. However, it is difficult to assure that all the cavities are completely filled and the pins are correctly formed with this process to proper density.

As a result, the process limits the heights of the fins or pins, the number of pins per unit area, the density of the metal, and hence the cooling capacity of the heat sink.

SUMMARY OF THE INVENTION

The invention features, in one aspect, a method of making a heat-sinking structure (e.g., a heat sink with a plurality of fins or pin-fins, or a heat-sinking compartment for housing electrical components) by providing a mold having cavities closed at one end and open at another end, the cavities corresponding to the heat dissipating surfaces on the heat-sinking structure, at least partially evacuating ambient gases from the cavities by applying a vacuum to the open end of the cavities, filling the mold with molten material when the mold is substantially evacuated by introducing the thermally conductive material into the mold at the open end of the cavities, and solidifying the thermally conductive material in the mold and removing the resultant molded heat-sinking structure.

In one embodiment, the mold has cavities that correspond to the fins or pin-fins in the heat-sinking structure to be molded. The mold is fully or partially evacuated, and thermally conductive material (e.g., aluminum) is introduced into the evacuated mold under pressure, and rapidly drawn into the entire length of the cavities. The material fills the cavities completely before it solidifies. As a result, partial filling of the mold cavities and the formation of air pockets (porosity) in the heat-sinking structure is avoided. Thus, in the finished heat-sinking structure, the fins or pin fins have a greater bulk density, and the heat-sinking structure has increased thermal conductivity over heat sinks made in a mold at atmospheric pressure.

Another aspect of the invention features the product of the above-described process, wherein the cavities form an array having at least several rows and at least several columns of cavities.

In another aspect of the invention, a combination electromagnetic interference filter and electrical socket assembly includes an electromagnetic interference filter, at least one conductive, single-piece, electrical terminal blade passing through the electromagnetic interference filter, and a block of electrically insulating material. The terminal blade provides an electrically conductive path and also provides a connection mechanism configured to inter-fit with another electrical conductor (e.g., an electrically conductive terminal receptacle in a plug). The electromagnetic filter comprising the single-piece electrical terminal blade is molded into the block of electrically insulating material to form an electrical socket. The single-piece electrical terminal blade passes through the block of electrically insulating material and has exposed ends. Thus, this aspect of the invention provides a simple construction of a socket combined with an EMI filter in which the single-piece terminal blade can be connected directly to a circuit board or other electrical components without having to be soldered to a metal post that passes through the EMI filter, which metal post is in turn soldered to an electrical conductor, such as a wire, that is attached to a circuit board.

Other features and advantages of the invention will be apparent from the following detailed description and from the claims.

DETAILED DESCRIPTION

Figure 1:
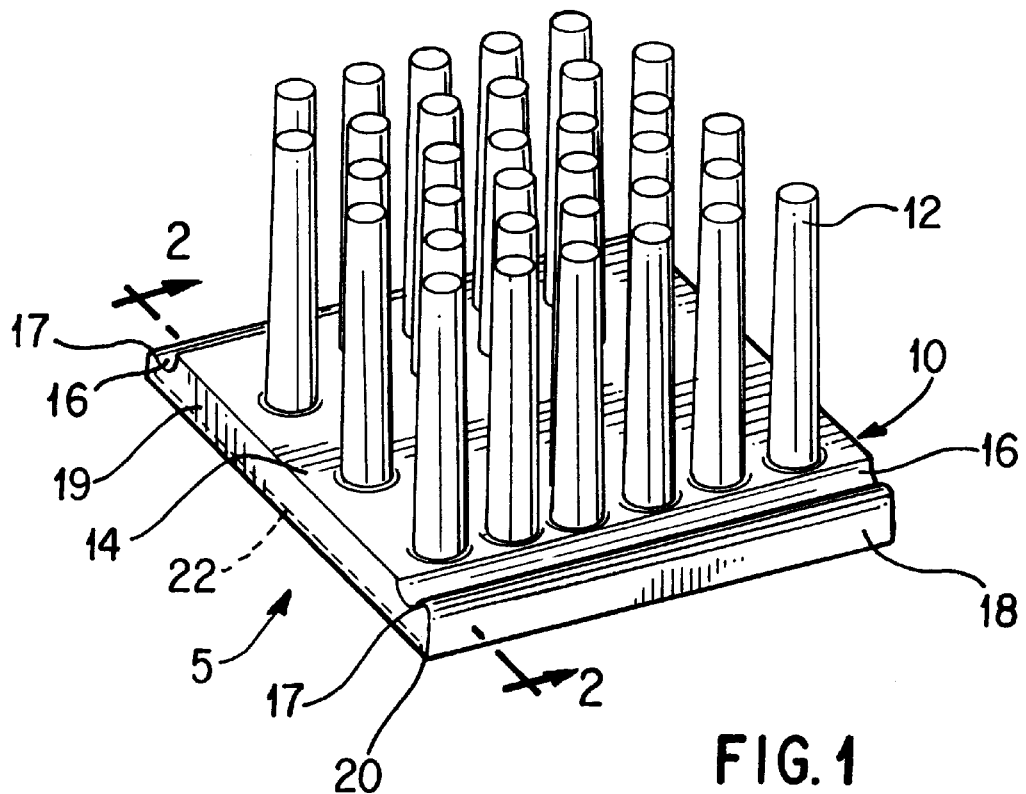
FIG. 1 is a perspective view of a pin-fin heat sink.
Figure 2:
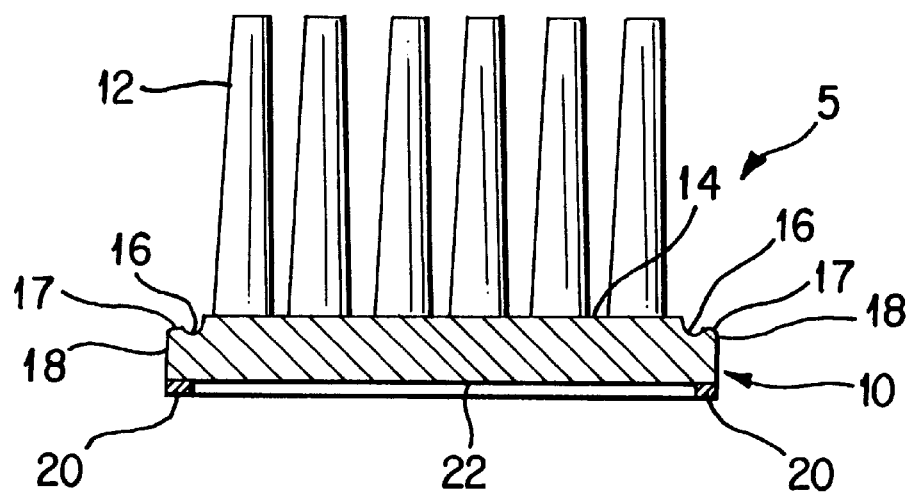
FIG. 2 is a section of a pin-fin heat sink taken along line 2—2 in FIG. 1.

Referring to FIGS. 1 and 2, a pin-fin heat sink 5 molded from thermally conductive material includes a backing plate 10. The backing plate has a front face 14, a back face 22, and two pairs of parallel side walls 18, 19. Each edge of the front face 14 adjacent to the two parallel side walls 18 terminates at an inner edge of a rounded groove 16. The outer edge of each groove 16 is rounded to form a shoulder 17. Around the perimeter of the back face 22 is a lip 20. The lip 20 and the back face 22 form a cavity 23 having dimensions selected to approximately match those of the semiconductor or the electrical device with which the heat sink 5 is to be used. Projecting from the front face 14 is a collection of pins 12. In operation, the pins 12 serve to dissipate heat from the semiconductor. This pin-fin type of heat sink is shown for illustrative purposes only, as other types of heat sinks may be made or used by or with the invention herein. As shown, in one embodiment, the pin fin heat sink 5 has pins 12 at least 0.10 inches long, and the pins are packed at a density of at least 10 pins per square inch. The pin length and density can vary substantially depending on the particular application for which the heat sink is used. For example, relatively hot electrical components could require a high pin density, long pins, and a high aspect ratio (surface area divided by volume). If an external convection system is provided, such as a fan, the pin density can be increased.

Figure 3:
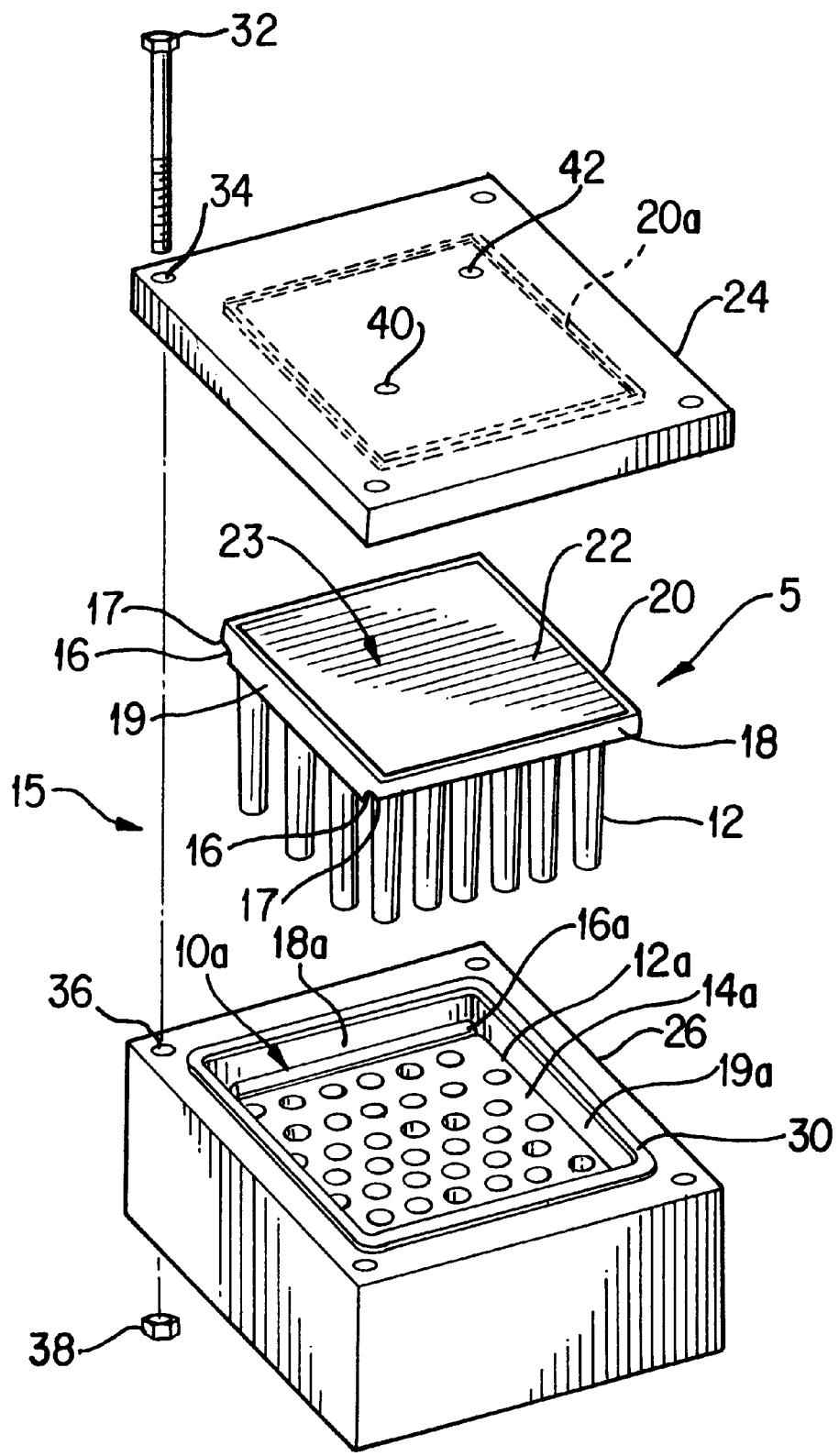
FIG. 3 is a perspective view of the pin-fin heat sink of FIG. 1 and a mold for making the heat sink.

Referring to FIG. 3, the heat sink 5 is fabricated in a mold 15 which comprises two mold halves 24 and 26. In one embodiment, the mold halves 24, 26 are made of steel. Recessed in the inside surface of mold half 24 is a groove 20a (shown in phantom) which corresponds to the lip 20 of the heat sink 5. Otherwise, the bottom surface of the mold half 24 is planar. A pair of apertures 40, 42 are disposed completely through the mold half 24.

The other mold half 26 contains an array of closely packed cavities 12a which will correspond to the pins 12 in the finished heat sink 5. The cavities 12a terminate at a surface 14a, which corresponds to the front face 14 of the heat sink 5, and which is recessed in a cavity 10a that corresponds to the backing plate 10. The surface 14a is edged on two sides by a pair of rounded shoulders 16a, corresponding to the grooves 16 in the finished heat sink. Pairs of surfaces 18a and 19a, which are orthogonal to the surface 14a, correspond to heat sink sidewall pairs 18 and 19 in the finished heat sink 5. A rubber gasket 30 is disposed about the circumference of the upper surface of mold half 26.

When the mold 15 is assembled for use, mold half 26 is pressed against the mold half 24, and the gasket 30 forms an air seal between the mold halves. Apertures 40, 42 communicate with the internal cavities 10a, 12a. Mold halves 24 and 26 are secured together by bolts 32 (only one shown) inserted through holes 34 and 36 in the four corners of the mold halves 24 and 26. Nuts 38 (only one shown) are used to secure the bolts 32.

A vacuum pump (not shown) is connected to aperture 40 and actuated to partially or fully remove air from the mold. While the mold 15 is under vacuum, molten thermally conductive casting material (e.g., aluminum or copper) is introduced through aperture 42. With any remaining air in the cavities 12(a) under reduced pressure, the casting material is easily drawn into the entire length of cavities 12(a), filling them completely without the formation of trapped air, resulting in increased material bulk density (and thus greater thermal conductivity) than with conventional die casting techniques. When the casting material has solidified and cooled sufficiently, the bolts 32 are removed and the molded halves 24, 26 are separated. The molded heat sink 5 is removed from mold half 26. The resulting vacuum die cast pins (or fins) are dense castings with no interconnected porously, and as a result, have greater thermal conductivity than conventional die cast heat sinks, with a bulk density corresponding to approximately 90% of the maximum specific gravity of the material used to cast the heat sink.

Heat sink backing plate 10 can be as thin as possible consistent with structural requirements and the heat sink can be fabricated from any material of a high heat capacity including alloys.

Other embodiments are within the following claims. For example, the fabrication method described above can be used to manufacture heat-sinking structures that perform functions in addition to the heat sinking function, such as the function of forming a housing for electrical components.

For example, it is possible, using the fabrication method described above, to form a compartment for housing the electronic components associated with high-intensity discharge (HID) headlights for automobiles. Such high-intensity discharge headlights are capable of illuminating objects at intensities higher than that of ordinary halogen headlights, but do not appear excessively bright to oncoming traffic. The electronic components associated with high-intensity discharge headlights include a large transformer and other high-power electronic devices, and are designed to permit the high-intensity discharge headlights to be turned on or off in a fraction of a second.

Figure 4:
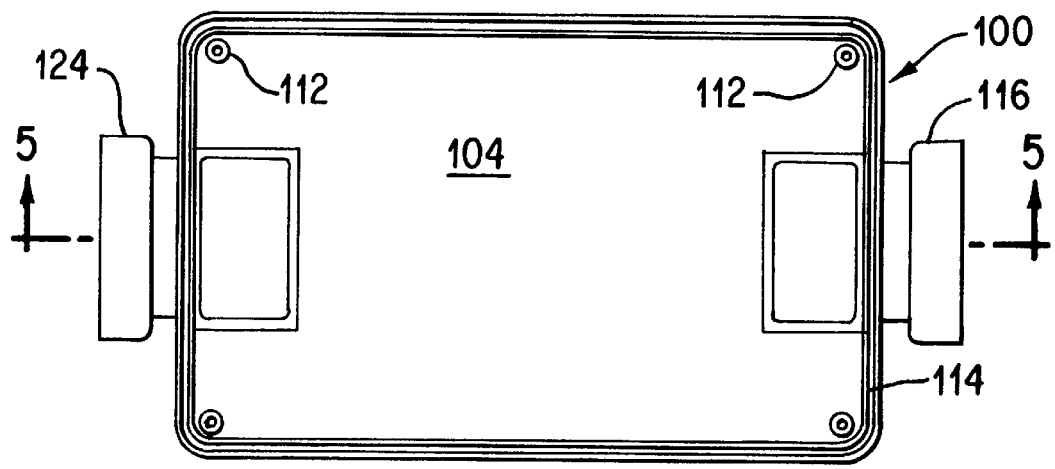
FIG. 4 is a top view of a heat-sinking portion of a compartment for housing electrical components.
Figure 5:
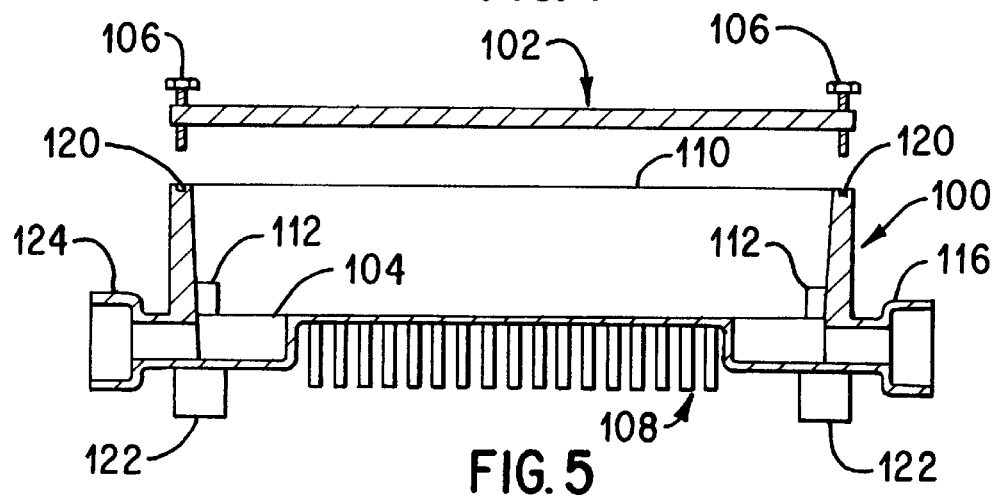
FIG. 5 is a cross-sectional side view of the heat-sinking portion of FIG. 4, taken along line 5—5 in FIG. 4, together with a cross-sectional side view of a cover portion of the compartment.
Figure 6:
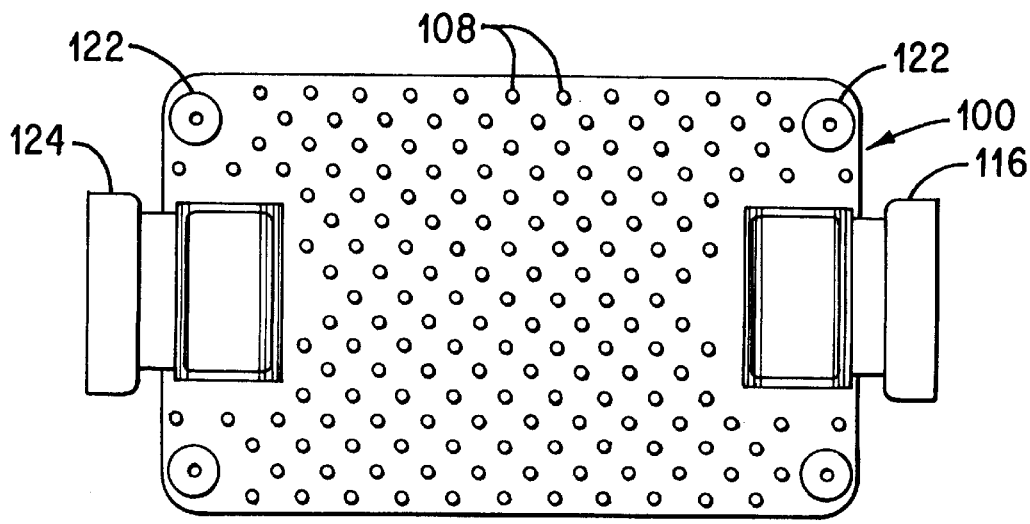
FIG. 6 is a bottom view of the heat-sinking portion of FIG. 4.

Referring to FIGS. 4, 5, and 6, a compartment is shown that can be used for housing high-power electronic components, such as an amplifier for a radio, an automobile engine control module, or electronic components associated with the above-mentioned high-intensity discharge headlights. The compartment includes a heat-sinking portion 100 and a cover portion 102 configured to mate with heat-sinking portion 100. Heat-sinking portion 100 and cover portion 102 may be manufactured from an alloy containing particles, which may be coated, non-coated, or a mixture of the two. The particle material and the volume of particles added to the alloy are selected so as to result in the alloy exhibiting desired values of physical and mechanical properties such as coefficient of thermal expansion, thermal conductivity, and tensile strength. In certain embodiments, coated particles are used each of which has a preselected volume fraction of coating material to particle material that results in the alloy that contains the coated particles exhibiting a desired coefficient of thermal expansion, a desired thermal conductivity, a desired tensile strength, or any combination of the above. The method of preselecting the volume fraction of coating material to particle material is described in co-pending U.S. patent application Ser. No. 07/731,809, filed Jul. 17, 1991, the entire disclosure of which is hereby incorporated herein by reference. If cover portion 102 is manufactured from the same material as heat-sinking portion 100, then cover portion 102 will provide radiational cooling, but cover portion 102 may alternatively be made of plastic.

The compartment may be conduction limited, or it may alternatively be non-conduction limited (for example, if the compartment is used in an automobile a fan may be bolted to the chassis of the automobile in the vicinity of the compartment to cool the compartment).

Heat-sinking portion 100 includes backing surface 104, which in one embodiment interfaces with a circuit board (not shown) that is attached to mounting bosses 112 of heat-sinking portion 100 by means of screws. A heat-conductive pad (not shown) is placed between the circuit board and backing surface 104. A compliant epoxy may be applied between the heat-conductive pad and the circuit board, and in certain embodiments the compliant epoxy may additionally be applied between the heat-conductive pad and the backing surface. In an alternative embodiment the circuit board is pressed flat against backing surface 104 and attached thereto by means of a compliant, thermally conductive interface material such as an epoxy. In other embodiments, at least a portion of backing surface 104 is not covered by a circuit board and the surfaces of electronic components are pressed flat against backing surface 104 and adhered thereto using a compliant, thermally conductive interface material such as an epoxy. Alternatively, heat-conductive pads are placed between and epoxied to the electronic components and the backing surface 104. The heat-conductive pads may be made of die-cast aluminum.

In the embodiments in which electronic components are adhered directly to the backing surface without the use of a circuit board, it is important to ensure that the coefficient of thermal expansion of the heat-sinking portion of the compartment closely and uniformly matches the coefficient of thermal expansion of the electronic components. This can be achieved, for example, by forming the compartment from an alloy containing coated particles formed in accordance with the method described in the above-mentioned U.S. patent application Ser. No. 07/731,809. In particular, by coating each of a large number of particles with approximately a preselected volume fraction of coating material to particle material for each particle, and by incorporating the coated particles into the alloy, it is possible to ensure that the coating material and particle material are relatively uniformly distributed within the alloy. This helps to provide a relatively uniform coefficient of thermal expansion throughout the compartment, the value of the coefficient of thermal expansion being dependent on the selected volume fraction.

Sidewalls 110, onto which electronic components can be clipped, screwed, or epoxied into place, also function as cooling fins that dissipate heat within the compartment.

A large array of pins 108, having many rows and columns, extends from backing surface 104 and serves to dissipate heat from the electronic components during operation. An O-ring groove 114 is provided on heat-sinking portion 100 to engage an O-ring that prevents water from entering the compartment between heat-sinking portion 100 and cover portion 102. Screw holes 120 are also provided in heat-sinking portion 100 and screws 106 are provided in cover portion 102 to enable the two portions to be screwed together. Mounting posts 122 on heat-sinking portion 100 enable the compartment to be mounted to an external structure, such as the chassis of an automobile within the engine compartment of the automobile, or a frame for an amplifier or light, etc.

Heat-sinking portion 100 includes a metal input socket enclosure 124, formed integrally with the remainder of heat-sinking portion 100, into which an input socket can be inserted. A metal output socket enclosure 116, analogous to metal input socket enclosure 124, is also formed integrally with the remainder of heat-sinking portion 100.

Figure 7:
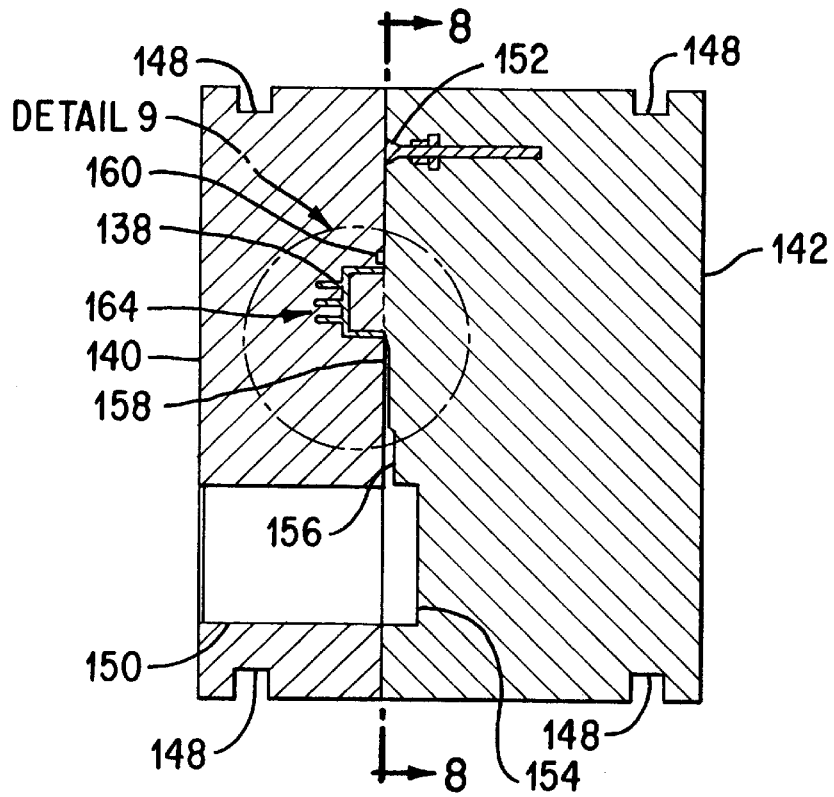
FIG. 7 is a cross-sectional view of a mold for forming a heat-sinking compartment.
Figure 8:
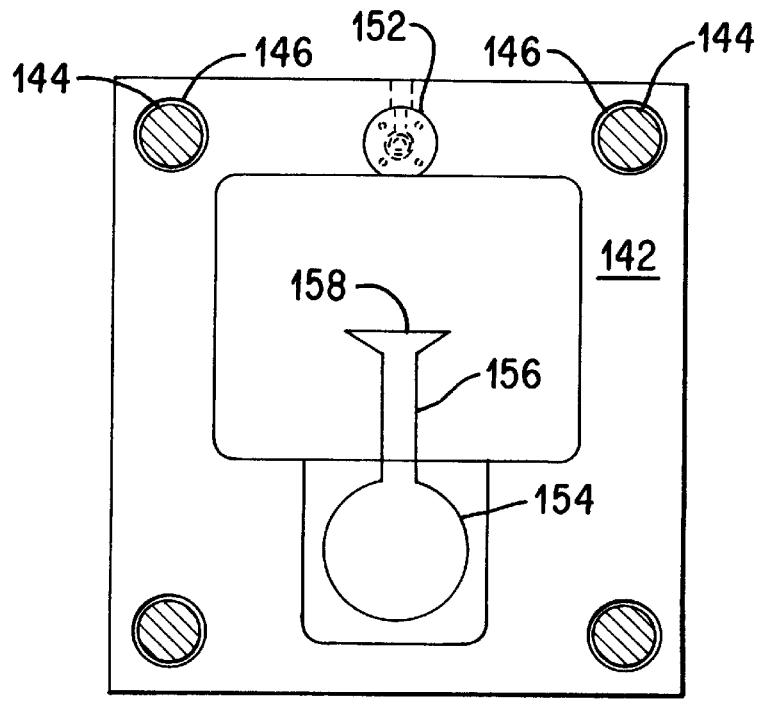
FIG. 8 is a view of the cover side of mold of FIG. 7, taken along line 8—8 in FIG. 7.
Figure 9:
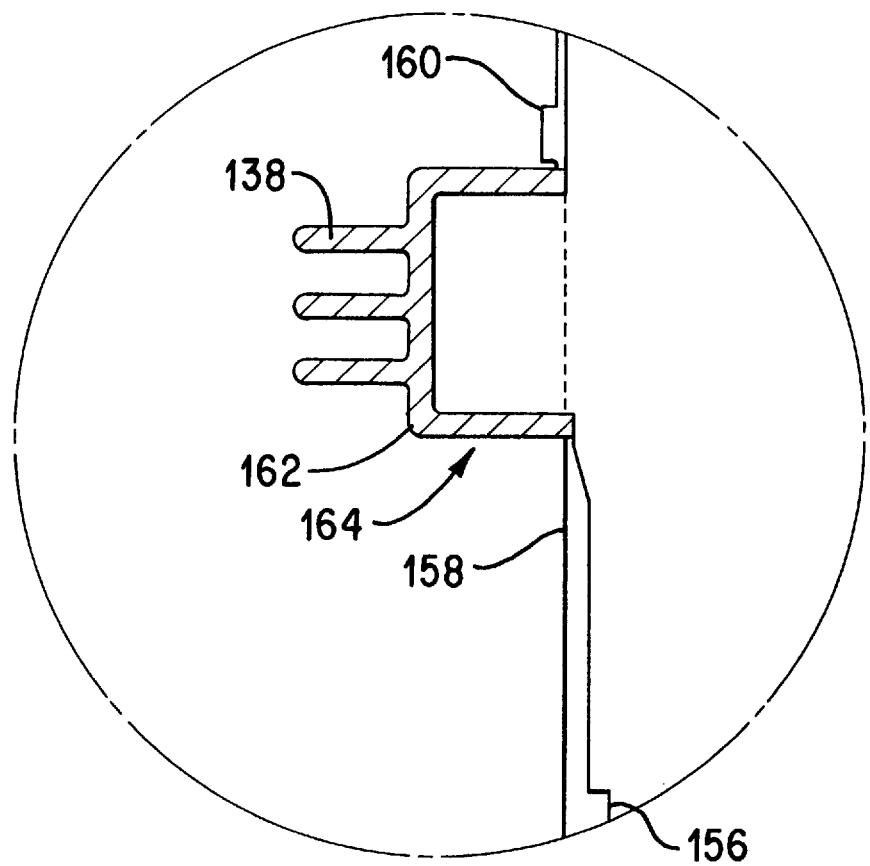
FIG. 9 is an enlarged view of the circled portion of FIG. 7 labelled "Detail 9," showing a schematic representation of a heat-sinking compartment together with a runner and a vacuum vent.

Referring to FIGS. 7, 8, and 9, a die for forming a compartment 164 such as the one shown in FIGS. 4, 5, and 6 includes an ejector side 140 and a cover side 142 that engage each other by means of a sliding mechanism that includes a set of steel rods 144 that project from ejector side 140 and fit into sleeves 146 in cover side 142. A set of notches 148 in ejector side 140 and cover side 142 are designed to be engaged by a die holder that opens and closes the die by moving ejector side 140 and cover side 142 away from each other or toward each other.

In the process of fabricating a compartment 164, ejector side 140 and cover side 142 are placed flush against each other, and then thermally conductive material out of which compartment 164 is to be formed is ladled into shot sleeve 150. Vacuum valve 152 is opened, thereby evacuating bisquit 154, runner 156, gate 158, the cavity 162 within which the compartment is to be formed, and vacuum vent 160. Vacuum valve 152 automatically shuts when the vacuum has reached the desired value. A shot arm (not shown) accelerates and forces the material out of which compartment 164 is to be formed from shot sleeve 150 into bisquit 154, runner 156, gate 158, and cavity 162. The compartment 164 cools, the shot arm is pulled back, the die is opened, and compartment 164 is ejected.

Because the vacuum is applied to the open end of the cavities 138 that define the heat-sinking pins or fins of the compartment, and because the thermally conductive material is fed into the mold at the open end of cavities 138, the thermally conductive material is rapidly drawn into the cavities and completely fills the cavities before solidifying. As a consequence, the heat-sinking pins or fins are densely cast and fully formed and therefore maximize thermal conductivity cooling capacity. By using close-ended cavities rather than cavities having vents at the ends of the cavities that are opposite to the ends at which the molten metal is applied, the fabrication process avoids the possibility that the heat-sinking compartment might become attached to the mold by solid strands of the injected thermally conductive material that form between the heat-dissipating surfaces of the pins or fins and the vents at the ends of the cavities. Such strands could cause one or more of the heat-dissipating surfaces to fracture and remain within the mold when the heat sink is removed. Thus, using the fabrication technique of the present invention, it is possible to construct heat-sinking structures having large arrays of small pins or fins that have low aspect ratios (surface area divided by volume), and thus the invention makes it possible to construct low-cost, light-weight heat-sinking structures that can house electrical components generating very substantial amounts of heat.

Figure 10:
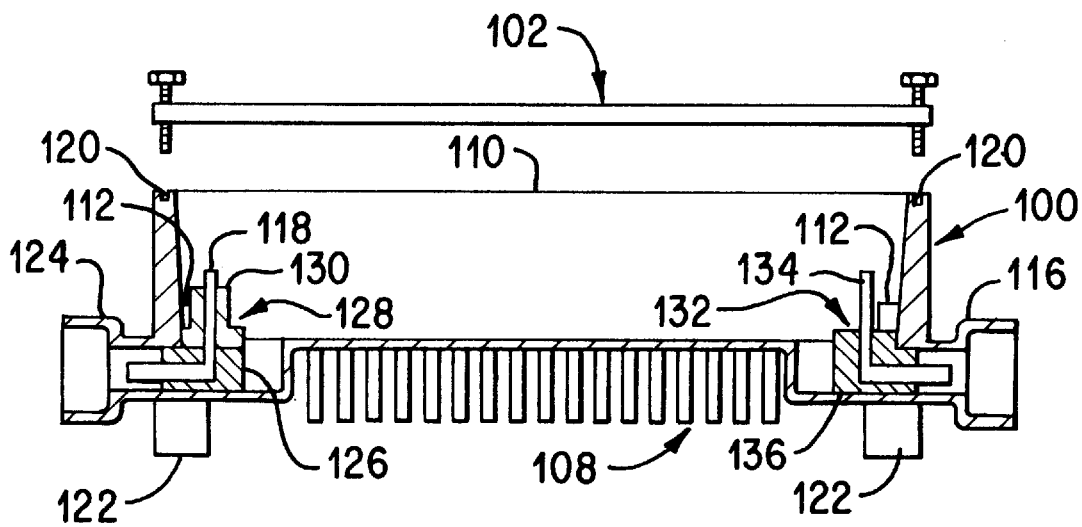
FIG. 10 is the cross-sectional view of FIG. 5 additionally showing an input socket and an output socket fixed in place within socket enclosures of the heat-sinking portion of the compartment, the input socket including an insert-molded EMI filter having one-piece terminal blades.

Referring to FIG. 10, input socket 128, which is designed to be fitted into input socket enclosure 124 of the compartment and hermetically sealed therewith, includes an insert-molded EMI filter 130 having a solid, one-piece terminal blade 118 assembled as an integral part of the EMI filter and extending completely through the EMI filter. The terminal blade is configured to inter-fit with an electrically conductive terminal receptacle in a plug (not shown). The manner of assembling EMI filter 130 having one-piece terminal blade 118 extending therethrough can be the same as the assembly of ordinary EMI filters having electrically conductive posts, rather than terminal blades, passing therethrough. EMI filter 130 and one-piece terminal blade 118 are insert molded into glass-filed polyester insert 126 together with another terminal blade (not shown) that serves as a ground. Additional terminal blades may also be provided. The insert molding process includes the steps of inserting EMI filter 130 (which includes terminal blade 118) and the other terminal blade that serves as the ground into a die, then over-molding the glass-filled polyester by injection molding. Input socket enclosure 124 physically protects input socket 128, but in an alternative embodiment input socket 128 can be attached to an external surface of the compartment, with the terminal blades passing through one or more holes in the compartment to connect with a circuit board or electrical components.

Output socket 132 includes a set of terminal blades (one of which, 134, is shown) insert molded into glass-filled polyester insert 136, but does not include an EMI filter. If the compartment houses electronic components for a high-intensity discharge lamp, then output socket 132 is connected to an igniter, which is in turn connected to the lamp. Output socket enclosure 116 prevents electromagnetic waves from entering into or out of output socket 132.

The fabrication method described above can be used to produce a wide variety of heat-sinking castings, including housings for various types of high-powered electronics in automobiles such as various automotive ballasts, engine module controllers, and lighting ballasts, and housings for other products that generate heat, as well as finned vacuum-die-cast heat-sinking covers for laptop computers. The castings may be incorporated into another heat exchanger, such as phase-change system, that pumps heat away from the electronics. The fabrication method may also be used to produce heat-sinking castings for use in areas in which there is no air, such as outer space applications. In outer space applications the electronic components can be so large they must be kept in an isolated location and a cooling medium must be provided to carry heat away from the heat-sinking compartment that holds the electronic components.

Other embodiments are within the following claims.

What is claimed is:

1. A process of making a heat dissipating structure for electronic circuitry, comprising the steps of:
   providing a die casting mold that defines a first cavity corresponding to a backing surface of the structure and a plurality of cavities each of which extends from an open end at said first cavity to a closed end and corresponds to a heat dissipating surface on the structure; said mold having a molten thermally conductive material entrance end,
   introducing molten thermally conductive material at said entrance end;
   at least substantially evacuating ambient gases from said cavities by applying a source of vacuum to the open end of said cavities;
   sealing said entrance end from atmosphere:
   blocking or shutting off said source;
   filling said mold with said thermally conductive material after said mold is substantially evacuated by feeding the thermally conductive material from said entrance end into said mold at the open end of said cavities; and
   solidifying said thermally conductive material in said mold and removing the resultant molded heat dissipating structure.

2. The process of claim 1 further comprising providing said mold with an interior surface configured to provide a lip on at least a portion of said backing surface that defines a mounting area for receiving the electronic circuitry.

3. The process of claim 2 wherein said interior surface is disposed around a perimeter of said backing surface and encloses the mounting area.

4. The process of claim 1 wherein said structure is a heat sink and said electronic circuitry includes a semiconductor component.

5. A process of making a heat-sinking structure, comprising the steps of:
   providing a mold having cavities closed at one end and open at another end, said cavities corresponding to the heat dissipating surfaces on the heat-sinking structure, said mold having a molten thermally conductive material entrance end;
   introducing molten thermally conductive material at said entrance end;
   at least substantially evacuating ambient gases from said cavities by applying a source of vacuum to the open end of said cavities;
   sealing said entrance end from atmosphere:
   blocking or shutting off said source:
   filling said mold with thermally conductive material after said mold is substantially evacuated by feeding the thermally conductive material from said entrance end into said mold at the open end of said cavities; and
   solidifying said thermally conductive material in said mold and removing the resultant molded heat-sinking structure.

6. A process in accordance with claim 5, further comprising the step of configuring said heat-sinking structure as at least a partial compartment structure formed of said thermally conductive material.

7. A process in accordance with claim 6, further comprising the step of configuring said compartment structure to form at least part of a housing for electrical components.

8. A process in accordance with claim 7, further comprising the step of configuring said compartment structure to comprise a socket enclosure formed integrally with said compartment structure and configured to accept an electrical socket.

9. A process in accordance with claim 6, further comprising the step of configuring said compartment structure to mate with a cover.

10. A process in accordance with claim 5, further comprising the step of configuring said heat dissipating surfaces of said heat-sinking structure as an array of pins.

11. A process in accordance with claim 5, further comprising the step of forming said thermally conductive material from an alloy comprising coated particles, and wherein said step of forming said thermally conductive material from said alloy comprising coated particles comprises selecting a value of an intrinsic property to be exhibited by said heat-sinking structure, selecting a volume fraction of coating material relative to particle material that will result in said heat-sinking structure exhibiting said value of said intrinsic property, and applying said coating on each of said particles in approximately said volume fraction.

12. A process in accordance with claim 11, wherein said intrinsic property comprises a coefficient of thermal expansion.

13. The process according to claim 5, wherein said thermally conductive material is selected from the group consisting of aluminum and copper.

14. A process of making a pin-fin heat sink comprising the steps of:
   providing a die casting mold having a plurality of closely packed elongated, narrow cavities closed at one end corresponding to the pin-fin heat dissipating surfaces on the heat sink; said mold having a molten thermally conductive material entrance end;

introducing molten thermally conductive material at said entrance end;

sealing said entrance end from atmosphere;

at least substantially evacuating ambient gases from said cavities by applying a source of vacuum to the open end of said cavities;

blocking or shutting off said source;

filling said mold with thermally conductive material after said mold is substantially evacuated by feeding the thermally conductive material from said entrance end into said mold at the open end of said cavities; and solidifying said thermally conductive material in said mold and removing the resultant molded pin-fin heat sink.

15. A process of making a pin-fin heat sink according to claim 14, wherein the closely packed elongated narrow cavities are elliptical or cylindrical in shape.

* * * * *